United States Patent
Partovi et al.

[11] Patent Number: 5,990,717
[45] Date of Patent: Nov. 23, 1999

[54] LATCHING METHOD

[75] Inventors: Hamid Partovi, Sunnyvale; Robert C. Burd, Santa Clara; Udin Salim; Frederick Weber, both of San Jose; Luigi Di Gregorio, Sunnyvale; Donald A. Draper, San Jose, all of Calif.

[73] Assignee: Advanced Micro Devices, Inc., Sunnyvale, Calif.

[21] Appl. No.: 09/037,198

[22] Filed: Mar. 9, 1998

Related U.S. Application Data

[63] Continuation of application No. 08/706,340, Aug. 30, 1996, Pat. No. 5,774,005
[60] Provisional application No. 60/003,563, Sep. 11, 1995, and provisional application No. 60/007,263, Nov. 6, 1995.

[51] Int. Cl.$^6$ ................................................. H03K 3/356
[52] U.S. Cl. ........................... 327/210; 327/203; 327/218
[58] Field of Search ..................................... 327/199–203, 327/208–213, 218; 326/98

[56] References Cited

U.S. PATENT DOCUMENTS

| | | | |
|---|---|---|---|
| 5,017,808 | 5/1991 | Ueno et al. | 327/218 |
| 5,517,145 | 5/1996 | Frank | 327/208 |
| 5,636,566 | 6/1997 | Rose, Jr. et al. | 327/200 |
| 5,764,089 | 6/1998 | Partovi et al. | 327/200 |

FOREIGN PATENT DOCUMENTS

| | | | |
|---|---|---|---|
| 60-70817 | 4/1985 | Japan | 327/210 |
| 404239810 | 8/1992 | Japan | 327/212 |
| 4-317212 | 11/1992 | Japan | 327/210 |

OTHER PUBLICATIONS

Bowhill William, "A 300 MHz 64b Quad–Issue CMOS RISC Microprocessor," 1995 IEEE International Solid–State Circuits Conference entitled Digest of Technical Papers, First Edition, Catalogue No. 95CH35753, Session 10, Microprocessors, Paper TP 10.7, pp. 182–183, 362.

Chappell Terry, "A 2–ns Cycle, 3.8–ns Access 512–kb CMOS ECL SRAM With a Fully Pipelined Architecture," IEEE Journal of Solid–State Circuits, vol. 26, No. 11, Nov. 1991, pp. 1577–1585.

Dobberpuhl Daniel, "A 200–MHz 64–b Dual–Issue CMOS Microprocessor," IEEE Journal of Solid–State Circuits, vol. 27, No. 11, Nov. 1992, pp. 1555–1567.

*Primary Examiner*—Tuan T. Lam
*Attorney, Agent, or Firm*—Townsend and Townsend and Crew LLP

[57] ABSTRACT

A high-performance flip-flop circuit implementation. The flip-flop circuit comprises an "implicit" one-shot to generate a delayed clock output (407). The flip-flop comprises a delay block (405) coupled to a clock input (210). The flip-flop may be a D-type flip-flop. In a positive-edge-triggered embodiment of the flip-flop, a falling edge (540) of the delayed clock output (407) follows a rising edge (544) of a clock signal after a delay period (548). The flip-flop clocks in new data at a data input (205) in response to the clock input (210) during this delay period (548). Data is held in a storage block (450). The flip-flop has extremely good transient characteristics, especially set-up and clock-to-output times. The flip-flop consumes no static power.

36 Claims, 8 Drawing Sheets

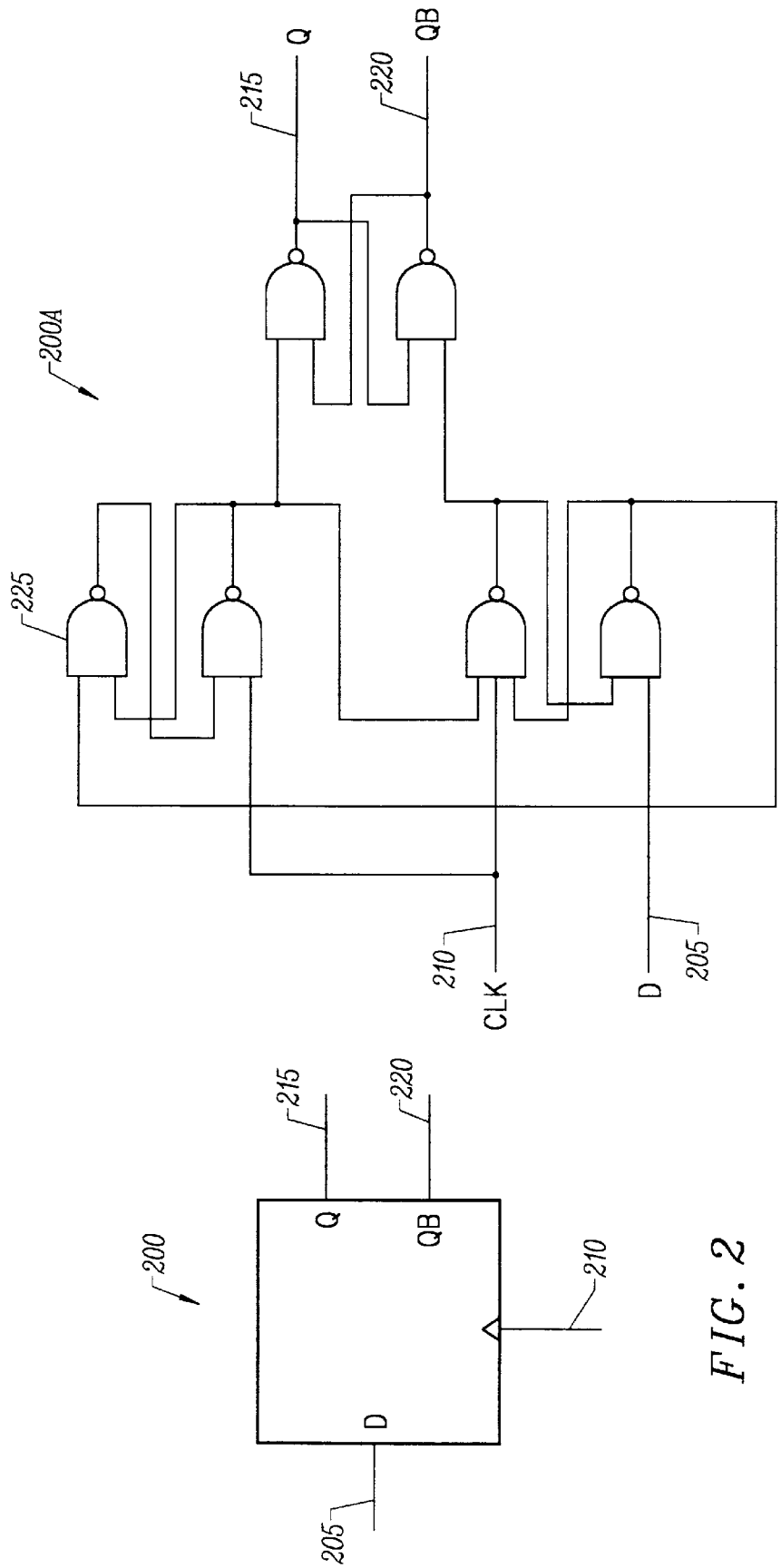

LATCHING METHOD

This application is a continuation of and claims the benefit of U.S. patent application Ser. No. 08/706,340, now U.S. Pat. No. 5,774,005 filed Aug. 30, 1996, which application claimed the benefit of provisional patent application Ser. No. 60/003,563, filed Sep. 11, 1995, and U.S. provisional patent application Ser. No. 60/007,263, filed Nov. 6, 1995, all of which are incorporated herein by reference.

BACKGROUND OF THE INVENTION

This invention relates to the field of digital logic circuits. More specifically, the present invention is a high-performance flip-flop circuit, especially useful in the design of high-performance electronic circuits.

A digital system is comprised of logic elements including AND gates, OR gates, NAND gates, NOR gates, inverters, flip-flops, multiplexers, and many others. These basic logic elements are combined and used to create larger, more complex logic functions such as registers, shifters, accumulators, state machines, processing units, and microprocessors, to name a few. These functions may be embodied on integrated circuits, printed circuit boards, and other similar techniques. Ultimately, using these logic elements, a digital system is created. Typical digital systems may contain millions of logic elements, or even more. Some examples of digital systems are computers, automated teller machines, modems, network servers, telecommunications systems, global positioning systems, satellite controllers, automotive controllers, industrial automation controllers, embedded controllers, laser printer controllers, and application-specific hardware.

Rapidly advancing technology allows the creation of more complex, higher functionality, and higher performance digital systems. Although existing digital systems have generally met with substantial success, improvements are continually needed to address the limitations of the present technology. Digital systems need to provide greater functionality. Improvements in process technology for integrated circuits allow greater numbers of logic elements to be placed on a single chip. Improvement in the logic elements themselves and accompanying layout also saves valuable silicon area, which increases the logic density. For example, reducing the number of logic elements needed to implement a logical function leads to an increase in the number of functions an electronic circuit can provide. Furthermore, digital systems need to provide increasingly higher performance. Since logic elements form the critical path for digital systems, higher performance logic elements can directly improve the overall performance of the system. For example, in a microprocessor there may be over 50,000 flip-flops; improving the performance of a basic flip-flop will generally greatly improve the overall performance of the processor. In addition to providing greater functionality and better performance, the logic elements must also provide reliability and low power consumption.

As can be seen, an improved implementation for a flip-flop is needed, especially a flip-flop with improved performance, improved efficiency, enhanced operating characteristics, and reduced size.

SUMMARY OF THE INVENTION

The present invention is a high-performance flip-flop. Flip-flops are a basic logic element used to build digital systems. The present invention may be used in many types of digital circuits and systems. For example, the present invention may be used in the design of a high-performance integrated circuit such as a microprocessor.

The flip-flop of present invention may be a D, J-K, S-R, or other type of flip-flop. Further, the flip-flop may be clocked on a positive or negative edge of a clock. The flip-flop circuit comprises an "implicit" one-shot to generate a delayed clock output. The flip-flop comprises a delay block coupled to a clock input. For a clock signal at the clock input, a corresponding delayed clock output signal is generated at an output of the delay block. More specifically, in a positive-edge-triggered embodiment of the flip-flop, a falling edge of the delayed clock output signal follows a rising edge of a clock signal after a delay period. Generally, this delay period should be less than a clock-to-output time of the flip-flop. The flip-flop clocks in new data at a data input in response to the clock input during this delay period. Data is held in a storage block until new data is clocked-in. The data is output using a Q output. An inverted output may be provided using a QB output. The flip-flop of the present invention has extremely good transient characteristics, especially set-up and clock-to-output times. The flip-flop consumes no static power.

In accordance with the teachings of this invention, a logic element is disclosed, which includes: a clock input; a data input; a flip-flop output, providing a logic high or logic low output; and a delay block, connected to the clock input, providing a delayed clock output. Further, there is a NAND gate, having a first input, a second input, a third input, and a NAND output. The first input of the NAND gate is connected to the clock input, the second input is connected to the data input, and the third input is connected to the delayed clock output. A first transistor is connected between a first supply and the flip-flop output, where a gate of the first transistor is connected to the NAND output. Moreover, a stack of at least three transistors in series is connected between the flip-flop output and a second supply, where the second supply is at a voltage below the first supply. In the stack of at least three transistors, there is a second transistor which is connected to the clock input, a third transistor which is connected to the NAND output, and a fourth transistor which is connected to the delayed clock output.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 2 is a block diagram showing a logic diagram for a flip-flop;

FIG. 3 shows a typical implementation of a flip-flop;

DESCRIPTION OF THE PREFERRED EMBODIMENT

Figure 1:
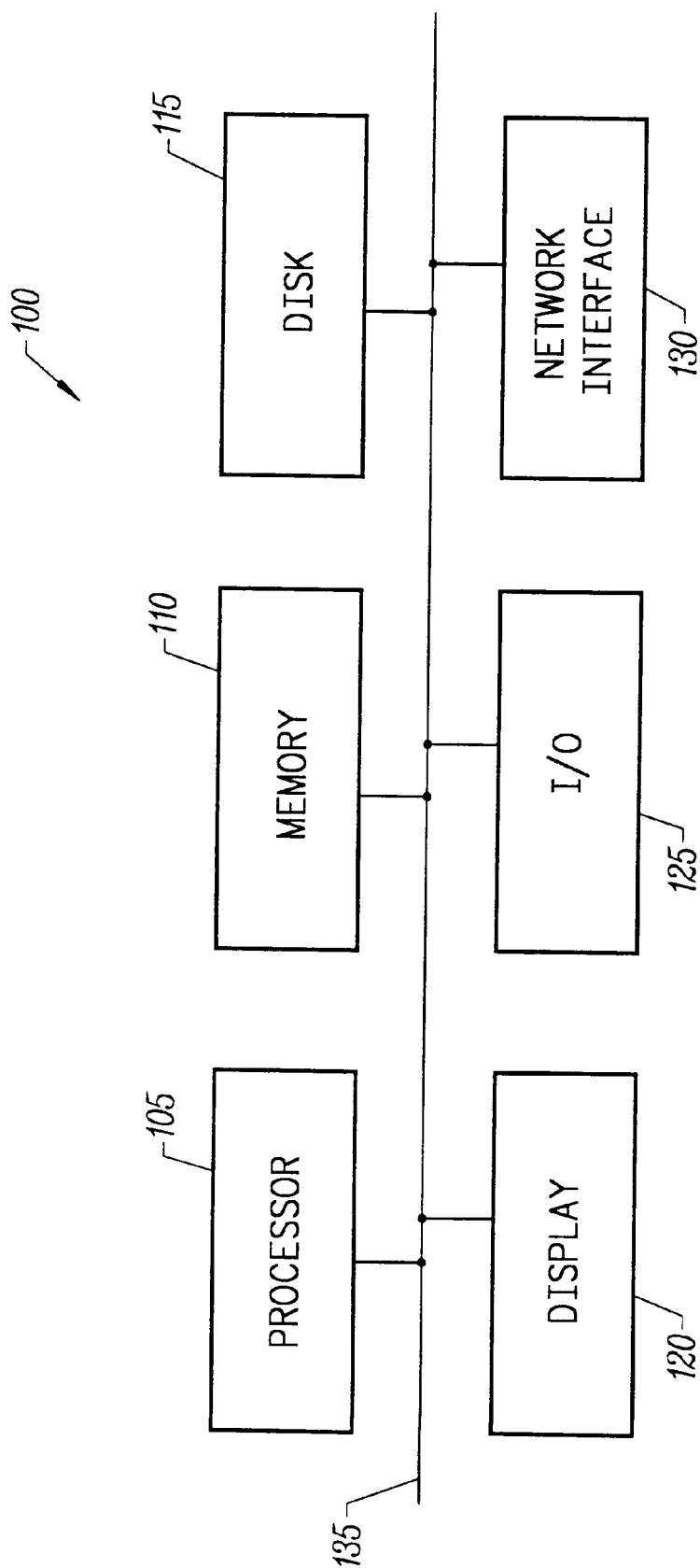
FIG. 1 is a block diagram of a digital system incorporating a present invention.

FIG. 1 is a diagram of a digital system 100 within which the present invention may be embodied. In digital system 100, a processor 105, memory 110, disk 115, display 120, I/O 125, and network interface 130 are coupled to a bus 135. Bus 135 facilitates the transfer of data between the components of this digital system. Digital system 100 may be a programmed digital computer system, digital signal processing system, specialized digital switching network, or other processing system. Moreover, the system may be a general-purpose computer, a special purpose computer (such as telecommunications equipment) optimized for an application-specific task such as programming an integrated circuit, or a combination of a general-purpose computer and auxiliary special purpose hardware.

Processor 105 may direct data to an appropriate system component for processing or storage, execute a program stored in memory 110, on disk 115, or input using I/O 111, or other similar function. Processor 105 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no centralized processing unit. For example, instead of having one CPU, processing may be distributed among many integrated circuits which control the logical operations of the system.

In some embodiments, processor 105 may even be a computer system. In one embodiment, source code may be stored on disk 115, compiled into machine language, loaded into memory 110, and executed by processor 105. Instead of storing source code in memory 110, only the machine language representation of the source code, without the source code, may be stored on disk 115 and loaded into memory 110 for execution by processor 105. Typically, memory 110 includes, among others, a random access memory (RAM) and read only memory (ROM). Disk 115 includes fixed or flexible disk media, PC Card flash disk memory, tape, or any other storage retrieval means, or any combination of these storage retrieval means.

Processor 105 uses I/O 125 to provide an input and output path for user interaction. I/O 125 may be a keyboard, mouse, track ball, digitizing tablet, touch screen, pen tablet, printer, or other input or output means, or any combination of these means. Display 120 is a specific input and output path for displaying text or graphical data on a monitor or screen. In one embodiment, I/O 125 includes a printer used for printing a hard copy of any processor 105 output. In particular, using I/O 125, a user may print a copy of a document prepared using a word processing program executed using processing unit 101. Network interface 130 is an input and output path for coupling this digital system 100 to other systems for communication and data exchange.

FIG. 2 is a diagram of a flip-flop 200. FIG. 2 shows the logic diagram for a basic D-type flip-flop. There are many other types of flip-flops such as S-R and J-K flip-flops. In fact, D flip-flops may be used in the implementation of these other types of flip-flops. In this discussion, D flip-flops are used to illustrate the principles of the present invention. However, the present invention may also be used in the design of many other types of flip-flops.

For flip-flop 200, there is a data (D) input 205, a clock (CLK) input 210, and Q output 215, and (optionally) a complementary QB output 220. A flip-flop is a basic building block of digital logic used to create sequential systems. Flip-flop 200 has memory and is used to construct circuits such as counters, registers, arithmetic accumulators, state machines, and many others. For example, many flip-flops are used in the design of digital system 100. A typical microprocessor may contain 50,000 or more flip-flops.

Flip-flop 200 is a positive-edge-triggered flip-flop, which means that the data present on D input 205 just before a clock transition for a low-to-high edge of the clock (at CLK input 210) determines the Q output state after the clock has transitioned. A negative-edge-triggered flip-flop may also be constructed similarly. A negative-edge-triggered flip-flop operates similarly, clocking in data on a high-to-low clock edge.

FIG. 3 shows a straightforward implementation of a positive-edge-triggered flip-flop, designated 200a. This implementation uses cross-coupled NAND gates 225. Although providing the proper flip-flop functionality, this particular implementation is generally too inefficient for most applications because it requires too much integrated circuit area and has relatively poor performance.

Figure 4:
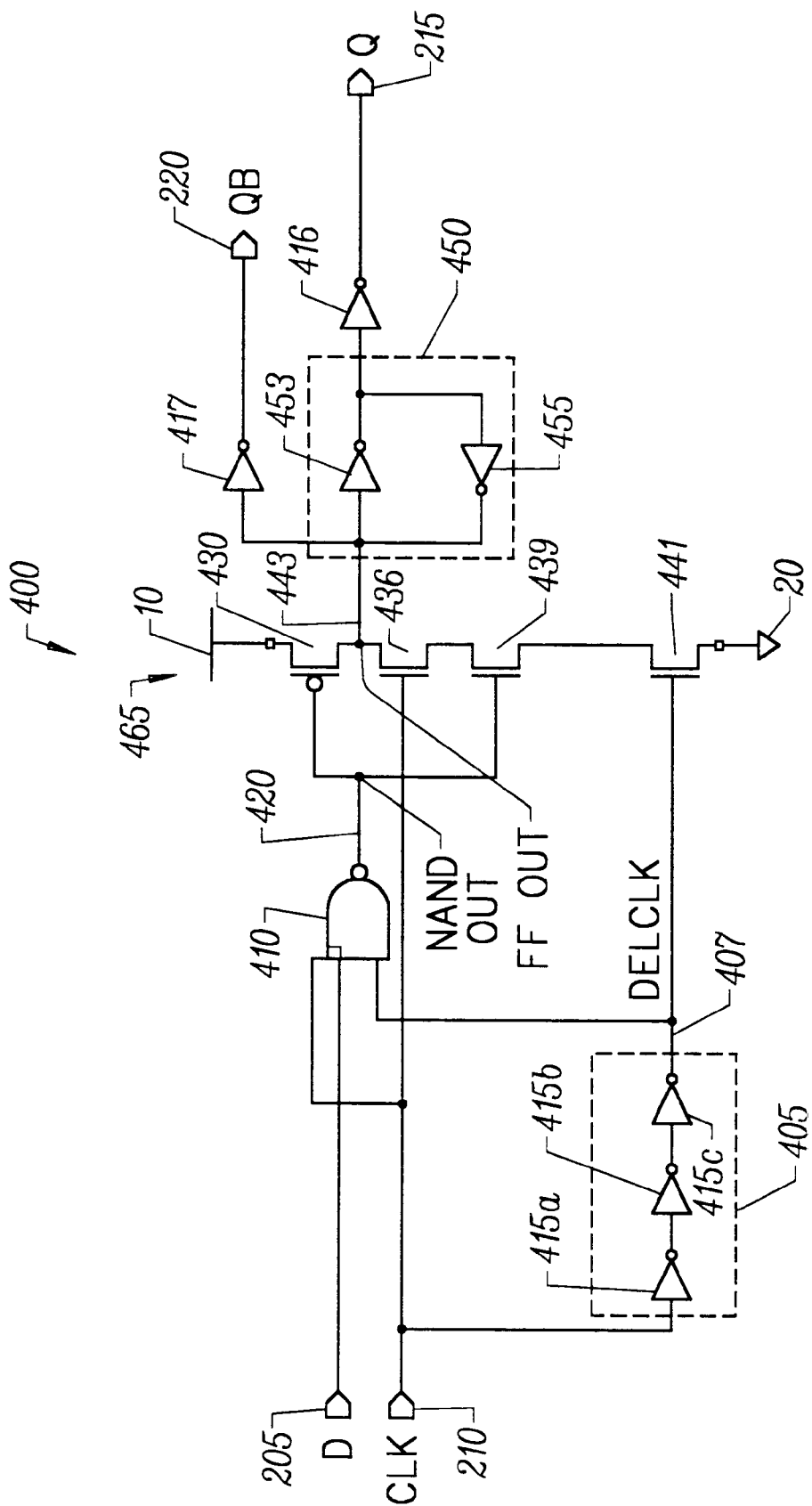
FIG. 4 shows an implementation of a flip-flop according to the present invention.

FIG. 4 shows an implementation of a flip-flop 400 of the present invention. In this configuration, there are D and CLK inputs 205 and 210 and Q and QB outputs 215 and 220 as in the prior art configuration. Flip-flop 400 clocks in data D at D input 205 in response to a positive edge of a CLK signal at CLK input 210. The CLK signal at CLK input 210 is input into a delay block 405, which generates a delayed clock output signal, DELCLK, at a delayed clock output 407. DELCLK is typically an inverse of CLK signal where a falling edge of DELCLK follows a rising edge at CLK by an amount of delay. In one embodiment, where a typical clock speed is about 125 MHz (clock period of about 8 nanoseconds), this delay is about two hundred picoseconds.

In a specific embodiment, delay block 405 is implemented using a chain of three inverters 415a–c. Other circuits configurations may be used depending on the amount of delay desired and amount of delay of the individual elements, among other considerations. For example, a delay chain with a single inverter may be used, or in other cases, a chain with more than three inverters may be used. In general, a chain with an odd number of inverters may be used. In alternative embodiments, the delay chain may include an RC delay or other logic elements such as NAND and NOR gates.

A NAND gate 410 has three inputs, D input 205, CLK input 210, and delayed clock output 407. NAND gate 410 provides a NAND OUT signal at a NAND output 420. NAND gate 410 will output a logic low at NAND output 420 when its three inputs are a logic high simultaneously. Otherwise, NAND OUT will be logic high. NAND gate 410 may be considered a first buffer for the flip-flop.

A chain of series-connected transistors 430, 436, 439, and 441 may be considered to form a second buffer 465 for the flip-flop. A PMOS transistor 430 is coupled between a first supply 10 and a first output node 443 of the flip-flop. A FF OUT signal is generated at first output node 443. First supply 10 is typically a voltage supply VDD (sometime referred to as VCC) for the integrated circuit. This voltage supply is generally about 5 volts, although voltage supplies of about 3.3 volts or lower are also common. Furthermore, first supply 10 may be a "local" supply, not the same of the voltage supply for the integrated circuit. A gate of PMOS transistor 430 is coupled to NAND output 420.

NMOS transistors 436, 439, and 441 are stacked and in series. NMOS transistor 436 is coupled between first output node 443 and a drain of NMOS transistor 439. A gate of NMOS transistor 436 is coupled to CLK input 210. NMOS transistor 439 is coupled between a source of NMOS transistor 436 and a drain of NMOS transistor 441. A gate of NMOS transistor 439 is coupled to NAND output 420. NMOS transistor 441 is coupled between a source of NMOS transistor 439 and a second supply 20. A gate of NMOS transistor 441 is coupled to delayed clock output 407. Second supply 20 is a voltage supply, below the first voltage supply. Second supply 20 is typically VSS, about ground or zero volts.

Note that since NMOS transistors 436, 439, and 441 are stacked and in series, the gates of these transistors may be coupled to the D input 205, CLK input 210, and delayed clock output 407 lines in any order. The order shown provides better performance due to considerations such as overlap capacitance.

Also, the CLK signal typically traverses and couples to many components on the entire integrated circuit. Therefore, it is desirable be keep the loading on the CLK signal to a minimum. Delay block 405 generally buffers CLK input 210 from NMOS transistor 441. Consequently, NMOS transistor 441 may be relatively large in size and have substantial capacitive loading, but at the same time, not unduly load the CLK signal.

When data D at D input 205 is clocked into flip-flop 200 in response to a positive clock edge at CLK input 210, data D is provided at first output node 443. First output node 443 is coupled to a storage block 450, which stores the logic of flip-flop 200. Many different storage methods may be used to implement storage block 450. For example, storage block may be a memory cell such as a RAM, DRAM, SRAM, EPROM, EEPROM, Flash EEPROM, as well as many others. This diagram shows a relatively simple embodiment of storage block 450. Here, storage block 450 comprises an inverter 453 and an inverter 455. First output node 443 inputs into inverter 453, and inverter 453 outputs to an input of inverter 455. An output of inverter 455 outputs to the input of inverter 453. Inverter 455 is weaker in drive than second buffer 465 of flip-flop 200. Consequently, inverter 455 can be made very small. Inverter 455 is a weak feedback inverter used to hold the logic state at first output node 443. In operation, first output node 443 drives the input of inverter 453. Then, this particular logic state is stored in storage block 450 until it is changed.

An inverter 416 is coupled between inverter 453 and Q output 215. This inverter 416 additionally buffers the output of flip-flop 200. Furthermore, an inverter 417 is coupled between first output node 443 and QB output 315. This inverter 417 additionally buffers the inverted output of flip-flop 200.

The embodiment shown in FIG. 4 is a positive-edge-triggered flip-flop. However, as known to those skilled in the art, the present invention may also be used to construct a negative-edge-triggered flip-flop by modifying the circuitry and logic appropriately. The same features and operation described herein that apply to a positive-edge-triggered flip-flop will also apply to a negative-edge-triggered version.

Figure 5:
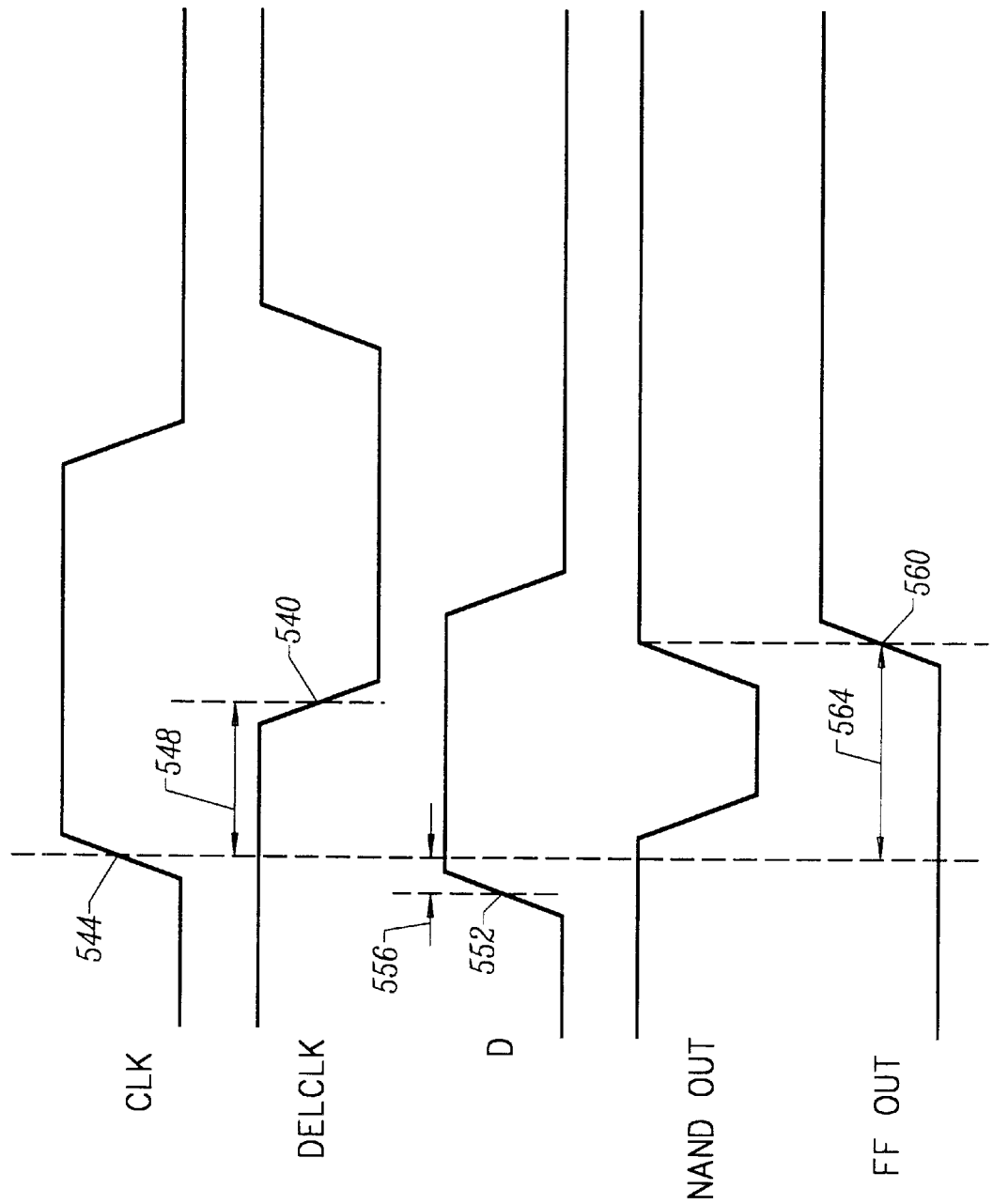
FIG. 5 is a timing diagram for storing a logic high in a flip-flop of the present invention.

The operation of flip-flop 400 will be described in more detail in connection with the timing diagrams of FIGS. 5–6. These timing diagrams are not necessarily drawn to scale, but are useful for illustrating particular features of the present invention. FIG. 5 shows a timing diagram for storing a logic high into flip-flop 400, while FIG. 6 shows the storing of a logic low.

In FIG. 5, waveforms for CLK, DELCLK, D, NAND OUT, and FF OUT are shown. CLK is a clock signal at CLK input 210. DELCLK is a waveform generated at delayed clock output 407. D shows input data at D input 205 for storing a logic high into flip-flop 200. NAND OUT is the corresponding output at NAND output 420. FF OUT is the corresponding output at first output node 443.

As shown, the falling edge 540 of DELCLK follows the rising edge 544 of CLK by a delay 548. The data D to be input into flip-flop 400 must be valid at least at time 552 (e.g., the rising edge of the data) before the CLK's rising edge 544. This time is referred to as a minimum setup time (TSU) 556. When D becomes a logic high, since CLK and DELCLK are also logic highs, NAND OUT becomes a logic low. When NAND OUT becomes a logic low, FF OUT will become a logic high in response. The time from rising edge 544 to a rising edge 560 of FF OUT is referred to a clock-to-output time (TCO) 564. Storage block 450 will store the logic high state of flip-flop 200. From first output node 443, a logic high state is passed to Q output 215, and a logic low state is passed to QB output 315.

Figure 6:
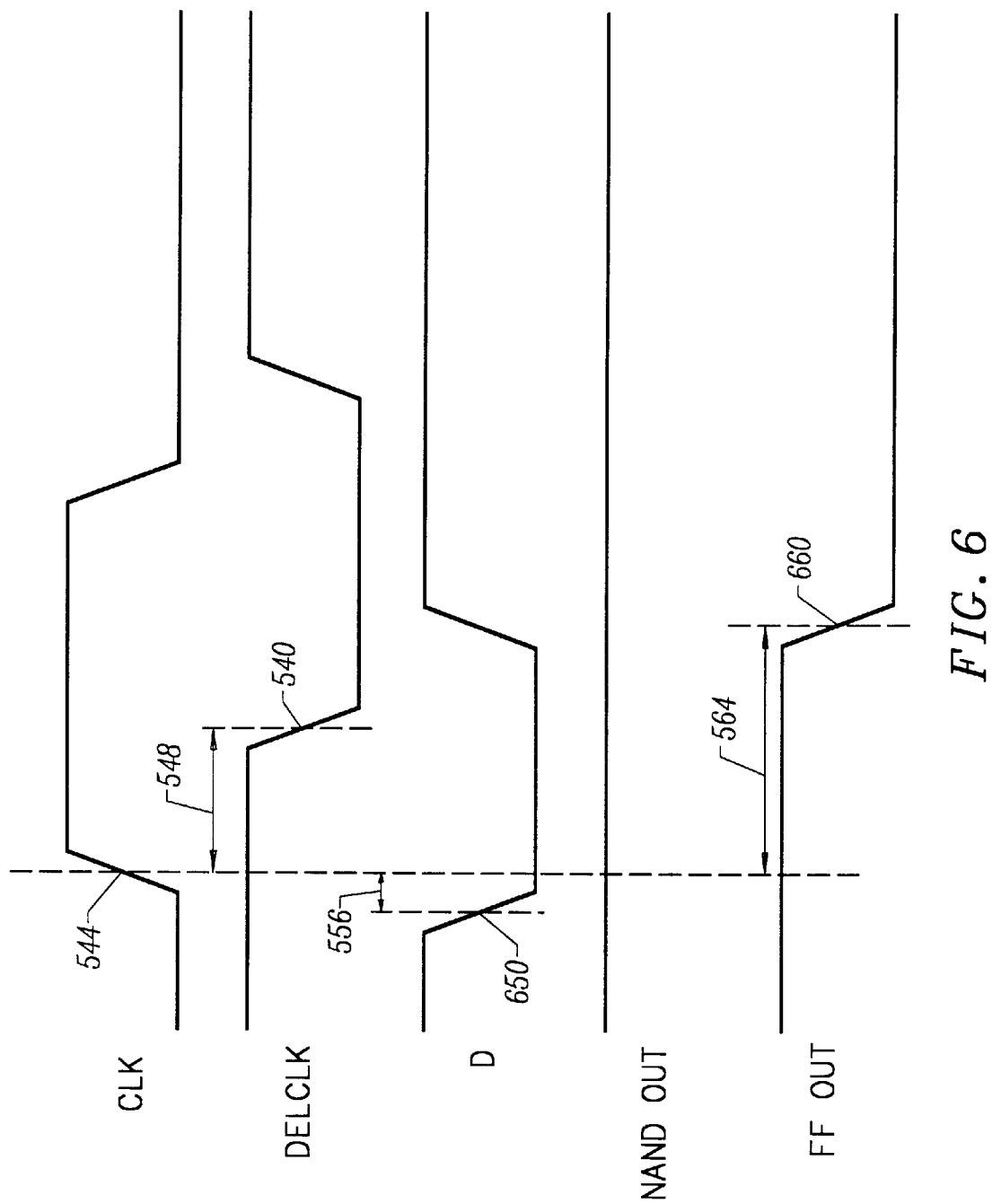
FIG. 6 is a timing diagram for storing a logic low in a flip-flop of the present invention.

Similarly, FIG. 6 shows a timing diagram for storing a logic low into flip-flop 400. Waveforms for CLK, DELCLK, D, NAND OUT, and FF OUT are shown. CLK is a clock signal at CLK input 210. DELCLK is the waveform generated at delayed clock output 407. D shows input data at D input 205 for storing a logic low into flip-flop 400. NAND OUT is the corresponding output at NAND output 420. FF OUT is the corresponding output at first output node 443.

As shown, the falling edge 540 of DELCLK follows the rising edge 544 of the CLK by a delay 548. The data D to be input into flip-flop 200 must be valid at least at time 650 (e.g., the falling edge of the data) before the clock's rising edge 544. This is the minimum setup time (TSU) 556. When D becomes a logic low, since CLK and DELCLK are logic highs, NAND OUT remains a logic high. During delay 548, NAND OUT, CLK, and DEL CLK are logic high. Then, FF OUT will become a logic low in response. The time from the rising edge 544 to a falling edge 660 of FF OUT is TCO 564. Storage block 450 will store the logic low state of flip-flop 200. From first output node 443, a logic low state is passed to Q output 215, and a logic high state is passed to QB output 315.

TSU 556 and TCO 564 are parameters which are generally critical to the performance of the entire integrated circuit. It is desirable to minimize TSU 556 and TCO 564 in order to maximize the performance of the integrated circuit, especially the transient performance. Specifically, the combination of TSU 556 and TCO 564 should be kept at a minimum. A minimum TSU 556 and TCO 564 means that flip-flop 400 will operate at a maximum frequency, which improves the transient performance of the integrated circuit. Compared to prior art flip-flops (e.g., such as shown in FIG. 3), flip-flop 400 of the present invention is about twice as fast. Furthermore, compared to typical flip-flops, flip-flop 400 of the present invention also has fewer components, thereby requiring less layout area.

Generally, the longer delay 548 is, the longer the data must be held (hold time or TH) or else wrong data may be clocked into flip-flop 400. For example, the hold time for the present invention may be positive. It is somewhat desirable to minimize the hold time at D input 205, making it zero or negative. However, a positive hold time may be compensated for by increasing the amount of delay of the circuitry coupling to D input 205. A tradeoff exists between TH, TSU 556, TCO 564. Generally, to maximize performance, TSU 556 and TCO 564 are the critical parameters. In order to maximize performance, in a preferred embodiment, delay 548 should be less than TCO 564. This also prevents race conditions from occurring. In the circuit configuration of FIG. 4, delay 548 is created using a chain of three inverters 415. However, a delay 548 which is too short creates problems too. For example, among other problems, a very short delay 548 also decreases the safety margin for latching data correctly.

The flip-flop 400 of the present invention essentially includes an "implicit" one-shot to generate the delayed clock output 407. This implicit one-shot is a current one-shot, which latches in the data after a delay 548 after the positive clock edge 544. Optimizing this implicit one-shot permits flip-flop 400 to operate at maximum speed. Specifically, during the period of delay 548, data at D input 205 may be clocked into flip-flop 400. For example, during delay 548, the signals at CLK input 210 and delayed clock output 407 become logic high. Then, Q output 215 will become the logic state at D input 205 at the time of a positive clock edge 544 at CLK input 210. During other periods of time, flip-flop 400 ignores the data at D input 205. Another characterization of the present invention is that of a flip-flop having a single buffer, which passes data clocked-in during the delay 548 period (where this delay is created using the implicit one-shot).

Note also, second buffer 465 of flip-flop 400 does not consume power except during a transition. Typically, the signal at CLK input 210 is the inverse of the signal at delayed clock output 407. Consequently, the stack of NMOS transistors 436, 439, and 441 will be decoupled from ground. NAND gate 410 will be a logic high, and PMOS transistor 430 will be off. Therefore, second buffer 465 will be essentially decoupled from VDD and VSS, and first output node 443 is tristated. Storage block 450 continues holding the flip-flop logic state. However, during the delay 548 period, second buffer 465 will be coupled to VDD and VSS to pass a high state or low state to storage block 450 as appropriate. Further, the other logic gates in flip-flop 400 are static gates. Therefore, flip-flop 400 consumes zero static power.

Figure 7:
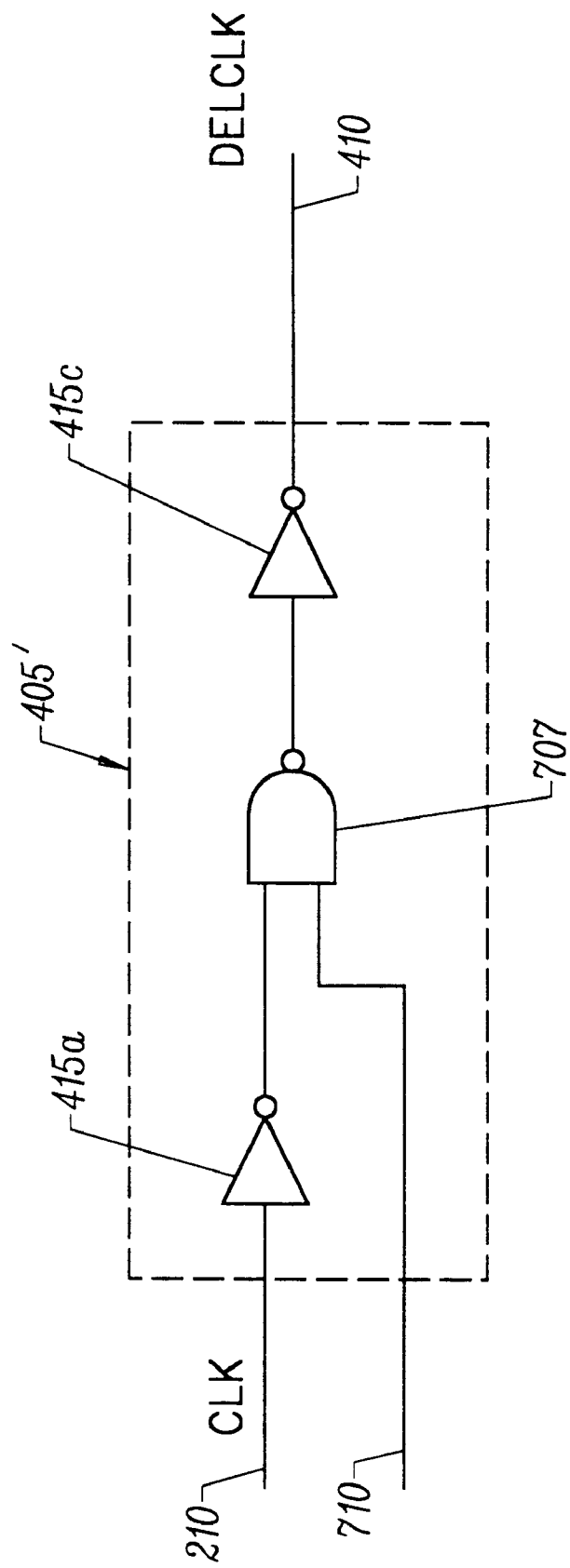
FIG. 7 is a diagram of a delay block including an enable feature.

FIG. 7 shows an alternative embodiment of the delay block 405' of the present invention. This implementation of delay block 405' permits an enable function for flip-flop 400 of FIG. 4. When a logic high, this enable function enables clocking of data into flip-flop 400. When a logic low, the enable function disables clocking of data. An enable function is useful in the design of many logic functions. For example, in a microprocessor, a number of flip-flops 200 with enable function may be used to create a register which has an enable feature.

In FIG. 7, the circuitry is very similar to a chain of three inverters 415a–c as shown in FIG. 4, except that the middle inverter is replaced with a NAND gate 707 having an input coupled to an enable input 710. More specifically, an input of inverter 415a is coupled to CLK input 210. This inverter's output is coupled to an input of NAND gate 707. Another input of NAND gate 707 is coupled to enable input 710. An output of NAND gate 707 is coupled to an input of inverter 415c. An output of this inverter outputs and provides delayed clock output 407.

This implementation of delay block 405' provides the necessary delay 548 and also provides an enable function. When an enable signal at enable input 710 is a logic high, then NAND gate 707 functions like an inverter. Delay block 405 functions as discussed above, providing delayed clock output 407. Clocking and normal operation of flip-flop 400 is enabled. When the enable signal at enable input 710 is a logic low, NAND gate 707 will output a logic high regardless of the state of CLK input 210. Then, the output at delayed clock output 407 will be a logic low. This disables the clocking of flip-flop 400. More specifically, in FIG. 4, NAND output 420 will be logic high; second buffer 465 will be decoupled from both VDD and VSS. New data may not be clocked into flip-flop 400, and the data stored in storage block 450 will remain.

Also, note that this enable function is a synchronous enable. For proper operation, the enable signal at enable input 710 should meet the minimum setup time requirements discussed above. Also, since this enable function disables the circuits in flip-flop 400, when flip-flop 400 is disabled, no power is consumed. Consequently, this enable function may be used as a power savings feature. For example, in a microprocessor, to reduce overall power consumption, certain portions of the circuitry may be disabled.

Figure 8:
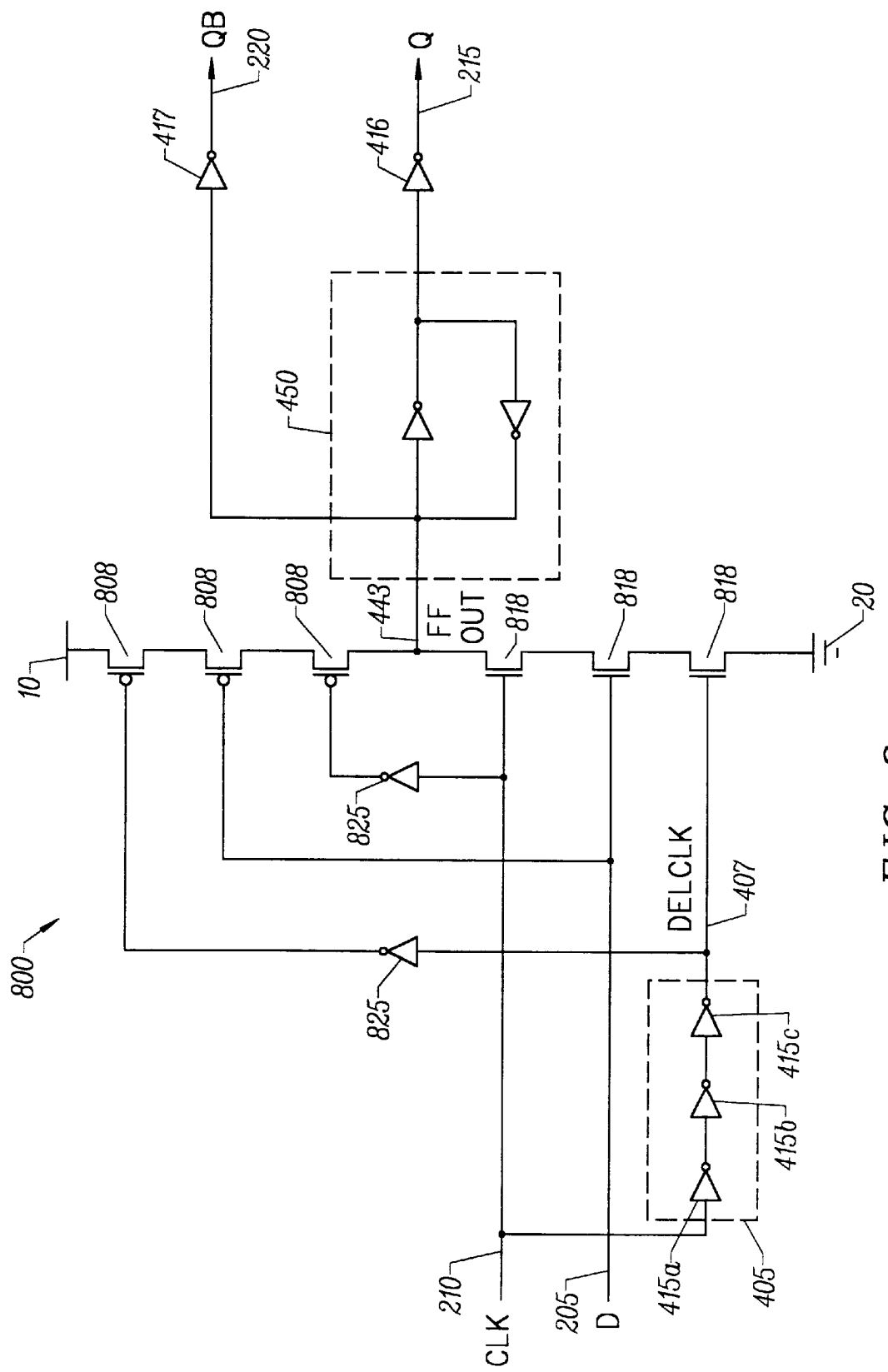
FIG. 8 is an another embodiment of a flip-flop of the present invention.

FIG. 8 is an alternative embodiment of a flip-flop 800 according to the present invention. This embodiment functions and operates similarly to the circuit in FIG. 4. Although this flip-flop implementation is positive-edge-triggered, a negative-edge-triggered implementation may be designed by modifying the logic and configuration of the circuitry appropriately. A stack of three PMOS transistors 808 is coupled in series between first supply 10 and first output node 443. A stack of three NMOS transistors 818 is coupled in series between first output node 443 and second supply 20. Similar to FIG. 4, first output node 443 is coupled to storage block 450. A Q output 215 and QB output 215 may be taken from this circuit in a similar fashion as shown in FIG. 4.

D input 205 is coupled to a gate of a first NMOS transistor 818 in the stack. CLK input 210 is coupled to a gate of a second NMOS transistor 818 in the stack. A clock signal, CLK, at CLK input 210 is coupled through delay block 405, which provides DELCLK at delayed clock output 407, to a third NMOS transistor 818 in the stack. Delay block 405 may be replaced with delay block 405 of FIG. 7 to provide an enable function for this flip-flop. A gate of a first PMOS transistor 808 in the stack is coupled to CLK input 210 through an inverter 825. A gate of a second PMOS transistor 808 in the stack is coupled to D input 205. A gate of a third PMOS transistor 808 in the stack is coupled to delayed clock output 407 through an inverter 825.

Figure 9:
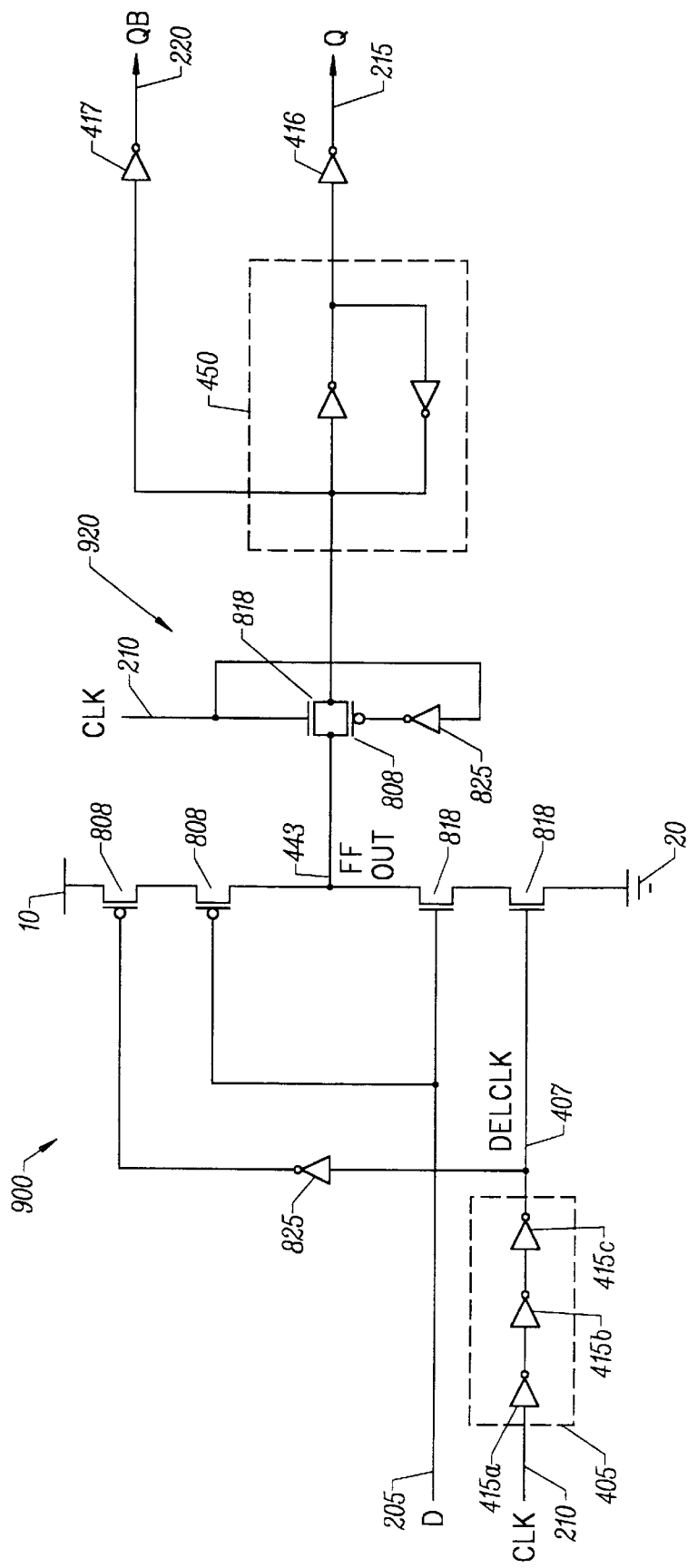
FIG. 9 is a further embodiment of a flip-flop of the present invention.

FIG. 9 is a further embodiment of a flip-flop 900 according to the present invention. This embodiment functions and operates similarly to the circuit in FIG. 4. Although this flip-flop implementation is positive-edge-triggered, a negative-edge-triggered implementation may be designed by modifying the logic and configuration of the circuitry appropriately. Moreover, this embodiment is very similar to the embodiment in FIG. 8 except that instead of having three PMOS and three NMOS transistors in stacks, a PMOS and NMOS transistor have been removed from the stacks and are used to form a pass gate 920.

More specifically, a stack of two PMOS transistors 808 is coupled in series between first supply 10 and first output node 443. A stack of two NMOS transistors 818 is coupled in series between first output node 443 and second supply 20. First output node 443 is coupled through pass gate 920 to storage block 450. Pass gate 920 is formed using an NMOS transistor 818 in parallel with a PMOS transistor 808. A Q output 215 and QB output 215 may be taken from this circuit in a similar fashion as shown in FIG. 4.

D input 205 is coupled to a gate of a first NMOS transistor 818 in the stack. A clock signal at CLK input 210 is coupled through delay block 405, which provides DELCLK at delayed clock output 407, to a second NMOS transistor 818 in the stack. Delay block 405 may be replaced with delay block 405 of FIG. 7 to provide an enable function for this flip-flop. CLK input 210 is coupled to a gate of NMOS transistor 818 used to form pass gate 920. A gate of a first PMOS transistor 808 in the stack is coupled to D input 205. A gate of a second PMOS transistor 808 in the stack is coupled to delayed clock output 407 through an inverter 825. A gate of PMOS transistor 808 of pass gate 920 is coupled to CLK input 210 through an inverter 825.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A logic circuit comprising:
    a data input;
    a first clock signal;
    a second clock signal, wherein the second clock signal is an inverse of the first clock signal and follows the first clock signal after a delay, the first clock signal and the second clock signal are in a logic high state for a period of the delay;
    a first buffer, coupled to the data input and the second clock signal, wherein the first buffer provides a first buffer output, which is an inverse of the data input when the second clock signal is in the logic high state; and
    a second buffer, coupled to the first buffer output, and the first clock signal, wherein the second buffer provides a second buffer output, which is an inverse of the first buffer output when the first clock signal is in the logic high state, wherein the first buffer is decoupled from a first supply and a second supply when not in the period of the delay.

2. The logic circuit of claim 1 wherein the second buffer comprises:
    a transmission gate, coupled to the first buffer output, wherein the transmission gate comprises a control electrode coupled to the first clock signal; and
    an inverting buffer coupled to receive the first buffer output from the transmission gate.

3. The logic circuit of claim 2 wherein the inverting buffer is an inverter.

4. The logic circuit of claim 2 further comprising:
    a feedback buffer coupled to feedback an inverse of an output of the inverting buffer to an input of the feedback buffer, wherein the inverting buffer and feedback buffer store a logical state representative on the data input.

5. The logic circuit of claim 2 wherein the transmission gate comprises:
    an NMOS transistor comprising a gate coupled to the first clock signal; and
    a PMOS transistor coupled in parallel to the NMOS transistor.

6. The logic circuit of claim 1 wherein the first buffer comprises:
    a first transistor coupled to the first supply;
    a second transistor coupled between the first transistor and the first buffer output;
    a third transistor coupled to the first buffer output, wherein the third transistor comprises a gate coupled to the data input; and
    a fourth transistor coupled between the third transistor and the second supply, wherein the fourth transistor comprises a gate coupled to the second clock signal.

7. The logic circuit of claim 6 wherein the first transistor comprises a gate coupled to the second clock signal and the second transistor comprises a gate coupled to the data input.

8. A method of implementing a logical function comprising:
    providing a data input signal and a clock signal;
    generating a delayed clock signal from the clock signal, wherein the clock signal and delayed clock signal are in a similar logic state during a delay period;
    in response to a transition of the clock signal, transferring the data input signal to a storage element during the delay period;
    holding a logical value representative of the data input signal in the storage element after the delay period; and
    decoupling the data input signal from the storage element after the delay period.

9. The method of claim 8 wherein the transferring the data input signal comprises passing the data input signal through at least one level of buffering.

10. The method of claim 8 wherein the decoupling the data input signal comprises decoupling a buffer from a power supply through which the data input signal is transferred to the storage element.

11. The method of claim 8 further comprising:
    permitting the data input signal to change after the delay period.

12. The method of claim 8 wherein the delayed clock signal is generated using an inverter chain.

13. The method of claim 9 wherein the logical function is a D flip-flop.

14. The method of claim 8 wherein a transition in the delayed clock signal corresponds to a transition in an opposite direction in the clock signal.

15. The method of claim 8 further comprising:
    disabling the generation of the delayed clock signal via an enable signal to disallow the transferring of the data input signal to the storage element.

16. The method of claim 8 wherein the transferring the data input signal to the storage element occurs in response to a positive edge transition of the clock signal.

17. The method of claim 8 wherein the transferring the data input signal to the storage element occurs in response to a negative edge transition of the clock signal.

18. A method of implementing a logical function comprising:
    providing a data input and a clock input;
    generating a delayed clock signal from the clock input, wherein the clock input and delayed clock signal are in a similar state during a delay period;
    in response to a transition of the clock input, coupling the data input to a storage element during the delay period; and
    holding a logical value representative of the data input in the storage element after the delay period.

19. The method of claim 18 further comprising:
decoupling the data input from the storage element after the delay period.

20. The method of claim 18 wherein the data input is coupled to the storage element throughout the delay period.

21. The method of claim 18 wherein the delayed clock signal is generated using three or more inverters coupled to the clock input.

22. The method of claim 18 wherein the transition is a positive clock edge.

23. The method of claim 18 wherein the transition is a negative clock edge.

24. The method of claim 18 wherein the logical function is a sequential logic function.

25. The method of claim 18 wherein the logical function is a flip-flop.

26. The method of claim 19 wherein the decoupling the data input occurs before a succeeding transition of the clock input.

27. The method of claim 26 wherein the succeeding transition of the clock input is a negative edge.

28. The method of claim 18 wherein the transition of the clock input generates an opposite transition in the delayed clock signal.

29. The method of claim 19 further comprising:
generating a logical output for the logical function before a succeeding transition of the clock input.

30. The method of claim 18 wherein the data input is provided before the transition of the clock input.

31. The method of claim 27 wherein the logical value representation is a logical one or a logical zero, and the storage element statically holds the logical value representation.

32. The method of claim 18 wherein the data input is coupled to the storage element through a first buffer.

33. The method of claim 32 wherein the first buffer is decoupled from a first supply voltage and a second supply voltage after the delay period.

34. The method of claim 33 wherein the first buffer comprises a PMOS transistor coupled between the first supply voltage and a first buffer output and a plurality of NMOS transistors coupled in series between the first buffer output and the second supply voltage.

35. The method of claim 34 wherein a gate of the PMOS transistor is coupled to a gate of one of the plurality of NMOS transistors.

36. The method of claim 34 wherein the storage element comprises a second buffer having an input coupled to the first buffer output and generating a logical function output.

* * * * *